(12) United States Patent
Lee

(10) Patent No.: US 9,031,261 B2
(45) Date of Patent: May 12, 2015

(54) BROADCAST ADVERTISEMENT VOLUME CONTROL SYSTEM AND METHOD THEREFOR

(71) Applicant: Korea Broadcast Advertising Corporation, Seoul (KR)

(72) Inventor: Won-Chang Lee, Seoul (KR)

(73) Assignee: Korea Broadcast Advertising Corporation, Seoul (KR)

( * ) Notice: Subject to any disclaimer, the term of this patent is extended or adjusted under 35 U.S.C. 154(b) by 367 days.

(21) Appl. No.: 13/753,042

(22) Filed: Jan. 29, 2013

(65) Prior Publication Data

US 2014/0105420 A1    Apr. 17, 2014

(30) Foreign Application Priority Data

Oct. 16, 2012 (KR) ........................ 10-2012-0114766

(51) Int. Cl.
*H03G 3/20* (2006.01)
*G06Q 30/02* (2012.01)
*H03G 3/00* (2006.01)
*H03G 3/30* (2006.01)
*H04H 20/10* (2008.01)

(52) U.S. Cl.
CPC ............. *H03G 3/20* (2013.01); *G06Q 30/0273* (2013.01); *H03G 3/002* (2013.01); *H03G 3/3026* (2013.01); *H04H 20/106* (2013.01)

(58) Field of Classification Search
None
See application file for complete search history.

(56) References Cited

U.S. PATENT DOCUMENTS

2007/0157224 A1* 7/2007 Pouliot et al. ................... 725/22
2009/0106086 A1* 4/2009 Morgan et al. .................. 705/10

FOREIGN PATENT DOCUMENTS

KR    10-2008-0045347 A    5/2008
KR         10-0982336 B1    9/2010

* cited by examiner

*Primary Examiner* — Andrew L Sniezek
(74) *Attorney, Agent, or Firm* — Rabin & Berdo, P.C.

(57) ABSTRACT

A system for controlling a volume of a broadcast advertisement including an advertisement agency server, a broadcaster server, a monitoring apparatus, and an advertisement company server, which are connected through a wire or wireless communication network is provided. The advertisement agency server includes an advertisement material storage unit, an advertisement material conversion unit, an advertisement watermark generation unit, a format conversion unit, and a cost calculation unit. The advertisement material conversion unit includes an advertisement reference volume storage unit for storing reference volume information of a volume included in the advertisement material, a volume comparison unit for comparing to determine whether an advertisement reference volume is different from a broadcaster reference volume stored in the broadcaster reference volume storage unit, and an advertisement volume conversion unit for storing the advertisement material having a changed volume and converted advertisement information in the advertisement agency server.

8 Claims, 4 Drawing Sheets

BROADCAST ADVERTISEMENT VOLUME CONTROL SYSTEM AND METHOD THEREFOR

BACKGROUND OF THE INVENTION

1. Field of the Invention

The present invention relates to a broadcast advertisement volume control system and a method therefor, and more particularly, to a broadcast advertisement volume control system and a method therefor in which a volume level of an advertisement material is matched to a reference volume level of each broadcaster and inserted to a specific program so that a volume level is equalized between an advertisement and a program to improve quality of broadcast.

2. Description of the Related Art

Generally, it is a trend of a broadcast advertisement that an advertiser such as a company or an individual who wants to advertise through a broadcast medium such as a television (TV) or a radio sends a request for advertisement to an advertisement company, and the advertisement company produces an advertisement material with respect to a product or an image requested by the advertiser and receives deliberation of the produced advertisement material to finally complete the advertisement material.

Next, the advertisement company requests for advertisement to a sales department of the Korea Broadcast Advertising Corporation (KOBACA) which performs a role of an advertisement agency so as to expose the advertisement material, which is deliberated, through the broadcast medium such as the TV or the radio requested by the advertiser, and accordingly, the sales department of the KOBACO confirms the advertisement request of the advertisement company through a sales meeting and notifies a result to the advertisement company.

Thus, when the advertisement request is confirmed by the KOBACO, the advertisement company notifies the result to the advertiser, discusses about an advertising schedule of the advertisement material, and submits the advertisement material to the KOBACO considering an editing timeline of a broadcaster, and the KOBACO requests the broadcaster to advertise the advertisement material.

Accordingly, the broadcaster edits the advertisement material according to each program, inserts the edited advertisement material into the program, and broadcasts an actual advertisement.

However, the advertisement material produced by the advertisement company does not conform to a reference volume level of each broadcaster due to internal factors such as a volume setting for an advertisement effect and external factors such as a recording place or recording equipment, and a reference volume varies according to each broadcaster. Thus, a volume of a program is not harmonized with a volume of an advertisement upon actual broadcasting, and therefore, when the advertisement is broadcasted during a broadcast program, a volume is abruptly decreased or increased, thereby causing inconvenience to a viewer and degrading quality of the broadcast.

Also, when the volume is arbitrarily controlled by the broadcaster, there is a problem in that a deliberated content is not the same as an advertisement content that is broadcasted and an intended advertisement effect may not be achieved.

PRIOR ART REFERENCE

Patent Reference (PATENT REFERENCE 0001) Korean Patent Application Publication No. 10-2008-0045347 (published on May 23, 2008)

(PATENT REFERENCE 0002) Korean Patent No. 10-0982336 (issued on Sep. 8, 2010)

SUMMARY OF THE INVENTION

Accordingly, the present invention has been made in view of the above problems, and an objective of the present invention is to provide a broadcast advertisement volume control system and a method therefor capable of improving quality of a broadcast by matching a volume level of an advertisement material to a reference volume level of each broadcaster.

Another objective of the present invention is to provide a broadcast advertisement volume control system and a method therefor capable of detecting a watermark of a reference volume from an advertisement material broadcasted through a broadcaster such that a deliberated advertisement and a main program are broadcasted with a harmonized volume.

In one aspect of the present invention, provided is a system for controlling a volume of a broadcast advertisement including an advertisement agency server 100, a broadcaster server 400, a monitoring apparatus 500, and an advertisement company server 300, which are connected through a wire or wireless communication network 600.

The advertisement agency server 100 includes an advertisement material storage unit 110, an advertisement material conversion unit 120, an advertisement watermark generation unit 130, a format conversion unit 150, and a cost calculation unit 140, and the advertisement material storage unit 110 stores an advertisement material including an advertisement material and advertisement information, the advertisement information comprising reference volume information about a volume included in the advertisement material, an advertiser identification code for identifying an advertiser, an advertisement broadcasting time of the advertisement material, and a total broadcast advertising time of the advertisement material.

The advertisement material conversion unit 120 includes a volume level adjustment unit 121, and the volume level adjustment unit 121 includes a broadcaster reference volume storage unit 122 for receiving a reference volume of a broadcast program of each broadcaster from the advertisement agency server 100 and storing the reference volume of the broadcast program, an advertisement reference volume storage unit 123 for storing reference volume information of a volume included in the advertisement material, a volume comparison unit 125 for comparing to determine whether an advertisement reference volume is different from a broadcaster reference volume stored in the broadcaster reference volume storage unit 122, and an advertisement volume conversion unit 126 for storing the advertisement material having a changed volume and converted advertisement information in the advertisement agency server 100.

The watermark generation unit 130 converts the changed advertisement information into watermark information to be included in the advertisement material, and the format conversion unit 150 converts the advertisement material including a watermark according to each video format of a broadcaster by which advertising is to be performed and stores the converted advertisement material in the advertisement agency server 100, and the advertisement agency server 100 sends the advertisement material of which format is converted to the broadcaster server 400.

The broadcaster server 400 inserts the advertisement material received from the advertisement agency server 100 into a specific broadcast program of a corresponding broadcaster to be sent to a local broadcaster for actual broadcasting.

The monitoring apparatus 500 monitors the actual broadcasting of each local broadcaster and obtains a monitoring result of each advertisement material to be sent to the advertisement agency server 100 by using a watermark extraction unit 510 for extracting the watermark included in the advertisement material and the advertiser identification code and the advertisement broadcasting time included in the extracted watermark.

The cost calculation unit 140 calculates an advertisement cost according to the monitoring result of the each advertisement material transmitted from the monitoring apparatus 500 to be sent to an advertisement company which requests an advertisement broadcasting of a corresponding advertisement material.

Meanwhile, the broadcaster server 400 may further include a watermark extraction unit 420 for extracting the watermark included in the advertisement material and a volume verification unit 430 for verifying a volume of a broadcast by using an advertisement identification code and a volume identification code stored in the watermark.

Also, the volume level adjustment unit 121 of the advertisement agency server 100 may further include an advertisement volume measurement unit 124 for measuring an average volume actually included in the advertisement material.

In another aspect of the present invention, provided is a control method of a system for controlling a volume of a broadcast advertisement including:

a broadcaster reference volume storage step in which an advertisement agency server 100 receives a reference volume of a broadcast program from each broadcaster and stores the reference volume in a broadcaster reference volume storage unit 122;

an advertisement material and advertisement information storage step in which an advertisement material and advertisement information including a advertisement reference volume of a volume included in the advertisement material, an advertiser identification code for identifying an advertiser, an advertisement broadcasting time of the advertisement material, and a total broadcast advertising time of the advertisement material are received from an advertisement company server 300 and stored in an advertisement material storage unit 110 of the advertisement agency server 100;

a reference volume comparison step in which the advertisement reference volume is compared to a broadcaster reference volume stored in the broadcaster reference volume storage unit 122 to determine whether there exists a difference therebetween;

an advertisement volume change step in which, when the advertisement reference volume sent from the advertisement company server is different from the broadcaster reference volume, a comparison result is notified to the advertisement company server 300 through the advertisement agency server 100 to change a volume of the advertisement material, and the advertisement material having the changed volume and changed advertisement information are stored;

a watermark generation step in which the changed advertisement information is generated into a watermark and inserted into the advertisement material of which volume is changed;

a format conversion step in which the advertisement material including the watermark is digitized and converted according to each video format of a broadcaster by which advertising of the advertisement material is to be performed;

an advertisement material transmission step in which the advertisement material of which format is converted is transmitted to a corresponding broadcaster server 400 through the advertisement agency server 100;

an actual broadcast step in which the advertisement material received from the advertisement agency server 100 is inserted into a specific program of a corresponding broadcaster by the broadcaster server 400 and transmitted to a local broadcaster to perform the actual broadcast;

an actual broadcasting step in which the broadcaster server 400 inserts the advertisement material received from the advertisement agency server 100 into a specific broadcast program of a corresponding broadcaster to be sent to a local broadcaster for actual broadcasting;

a monitoring step in which, when the advertisement material is inserted into the specific broadcast program to be broadcasted, a watermark extraction unit 510 of a monitoring apparatus 500 extracts the watermark inserted in the advertisement material, obtains a monitoring result of each advertisement material by using the advertiser identification code and the advertisement broadcasting time stored in the extracted watermark, and transmit the monitoring result to the advertisement agency server 100;

an advertisement cost transmission step in which an advertisement cost calculation unit 140 of the advertisement agency server 100 calculates an advertisement cost of a corresponding advertisement material and transmits the calculated advertisement cost to an advertisement company which requests an advertisement broadcasting of the corresponding advertisement material; and an advertisement cost calculation step in which the advertisement company transmits a calculated advertisement cost to the advertiser based on the transmitted advertisement cost A broadcast advertisement volume control system and a method therefore according to the present invention have the following effects.

First, since a volume level of an advertisement material is matched to a reference volume level of each broadcaster, quality of a broadcast may be improved without causing a problem of an increase or a decrease in volume at a time when an advertisement begins in a broadcast program or when an advertisement is broadcasted during the broadcast program.

Secondly, an advertisement which is the same as a content deliberated by a broadcasting and communications deliberation committee may be broadcasted.

Thirdly, an advertising cost of the advertisement material is calculated based on whether a volume of each advertisement material is appropriate, an advertiser identification code, and a total broadcast advertising time such that it is advantageous in that the advertising may be calculated according to the quality of the broadcast.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Hereinafter, exemplary embodiments of a broadcast advertisement volume control system using a watermark and a method therefor according to the present invention will be described with reference to the accompanying drawings.

Figure 1:
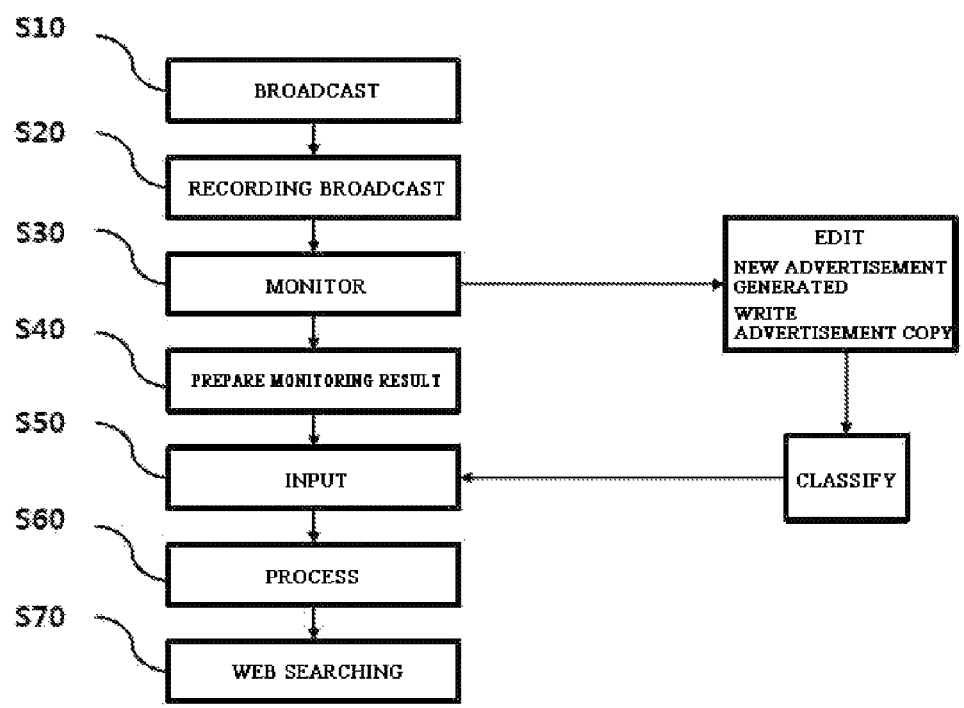
FIG. 1 is a procedure view of a conventional method of monitoring a broadcast advertisement.
Figure 2:
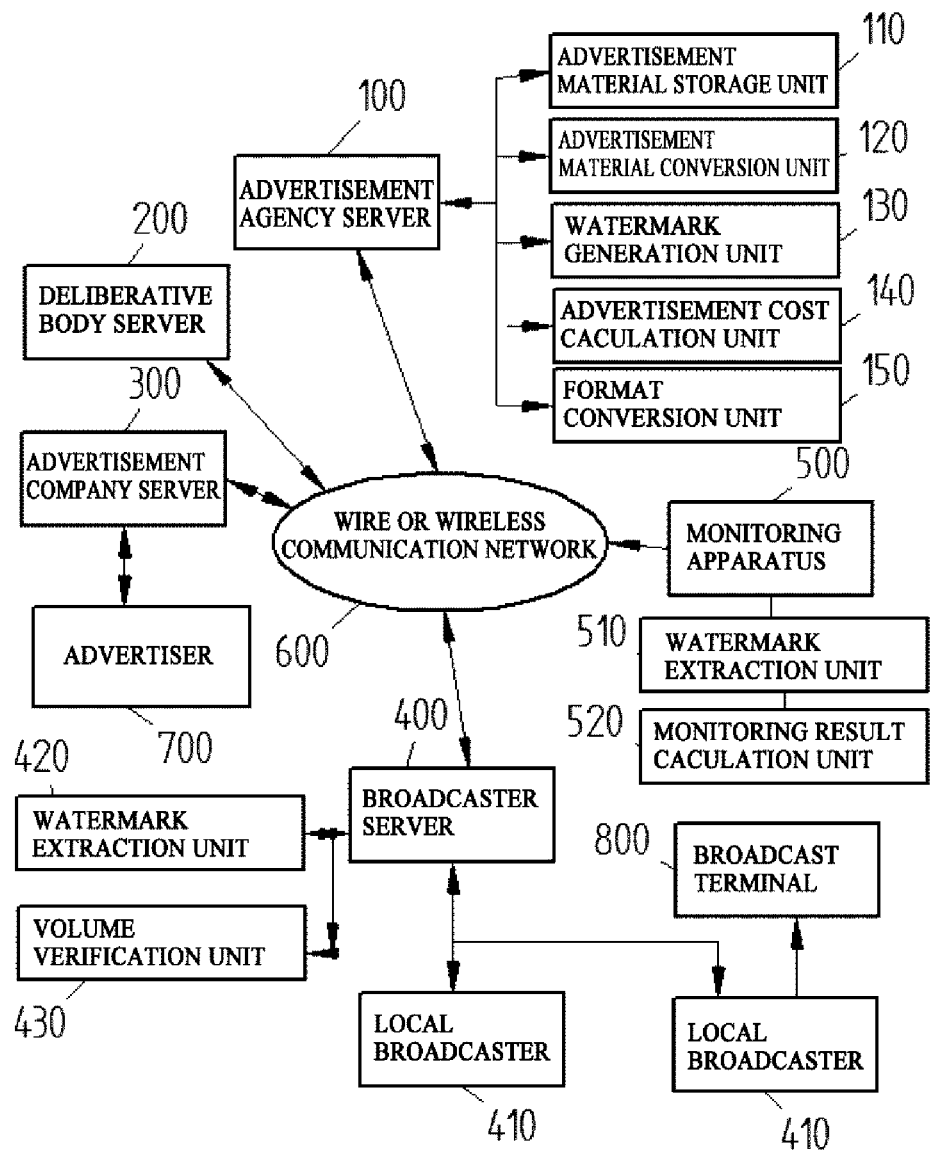
FIG. 2 is a configuration view of a broadcast advertisement volume control system according to an exemplary embodiment of the present invention.
Figure 3:
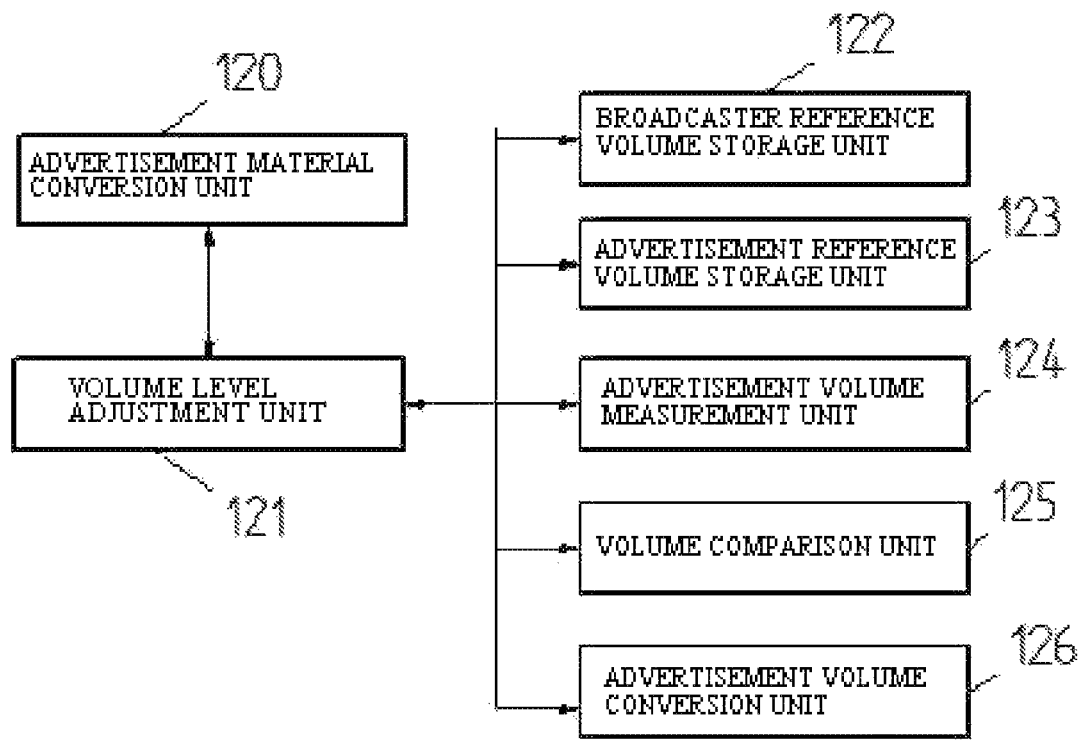
FIG. 3 is a detailed configuration view of an advertisement material conversion unit according to an exemplary embodiment of the present invention.

Referring to FIG. 2, a broadcast advertisement volume control system according to an exemplary embodiment of the present invention will be described.

The broadcast advertisement volume control system according to an exemplary embodiment of the present invention includes an advertisement agency server 100, a deliberative body server 200, a broadcaster server 400, a monitoring apparatus 500 and an advertisement company server 300.

On the other hand, the advertisement agency server 100 includes an advertisement material storage unit 110, an advertisement material conversion unit 120, an advertisement watermark generation unit 130, a format conversion unit 150, and a cost calculation unit 140.

On the other hand, the advertisement company server 400 transmits an advertisement material, which is produced in response to a request from an advertiser, to the advertisement agency server 100, and the advertisement material includes an advertisement material produced by an advertisement company in response to the request from the advertiser and advertisement information including reference volume information of a volume included in the advertisement material, advertiser identification code for identifying the advertiser, an advertisement broadcasting time of the advertisement material, and a total broadcast advertising time of the advertisement material, and all this information is stored in the advertisement material storage unit 110.

The advertisement material conversion unit 120 includes a volume level adjustment unit 121, and the volume level adjustment unit 121 includes a broadcaster reference volume storage unit 122 for receiving a reference volume of a broadcast program of each broadcaster from the advertisement agency server 100 and storing the reference volume of the broadcast program, an advertisement reference volume storage unit 123 for storing reference volume information of a volume included in the advertisement material, an advertisement volume measurement unit 124 for obtaining an average value of a volume actually included in the advertisement material, a volume comparison unit 125 for comparing to determine whether the average value of the volume of the advertisement material is different from the reference volume stored in the advertisement reference volume storage unit 123 or whether an advertisement reference volume is different from a broadcaster reference volume stored in the broadcaster reference volume storage unit 122, and an advertisement volume conversion unit 126 for notifying a comparison value to the advertisement agency server 100 to change the volume of the advertisement material and storing the advertisement material having the changed volume and changed advertisement information in the advertisement agency server 100 when, according to the comparison by the volume comparison unit 125, the reference volume sent from the advertisement company server is different from an average value of the actual volume of the advertisement material or when the advertisement reference volume sent from the advertisement company server is different from the broadcaster reference volume.

Here, when the reference volume sent from the advertisement company server is different from the average value of the actual volume of the advertisement material, it is determined whether the volume is intentionally increased by the advertisement company.

In the advertisement material having the changed volume, advertisement information is converted by the watermark generation unit into watermark information, is included in the advertisement material, and sent to the deliberative body server 200 such as a broadcasting and communications deliberation committee, and a deliberation registration number is assigned after the deliberation is completed, wherein the deliberation registration number is generated into the watermark to be included into the advertisement material.

Thus, the advertisement material, which includes, as the watermark, converted advertisement information such as the reference volume information, converted reference volume information, the advertiser identification code for identifying the advertiser, the advertisement broadcasting time of the advertisement material, the total broadcast advertising time of the advertisement material, and the deliberation registration number, is converted by the format conversion unit 150 into a video format of a broadcaster which performs the advertisement of a corresponding advertisement material and sent to the broadcaster server 400, and, based on information of the watermark, the broadcaster server 400 inserts the advertisement material into the broadcast program to be sent to each local broadcaster for actual broadcasting.

On the other hand, the monitoring apparatus 500 includes a watermark extraction unit 510 and a monitoring result calculation unit 520, wherein the watermark extraction unit 510 extracts the watermark inserted into the advertisement material when the advertisement material is inserted into a specific program and broadcasted, and the monitoring result calculation unit 320 calculates a monitoring result for each advertisement material by using the advertiser identification code and the advertisement broadcasting time stored in the extracted watermark. Namely, a total advertisement broadcasting time during the broadcast program for each advertiser identification code is calculated and transmitted to the advertisement agency server 100.

The advertisement cost calculation unit 140 of the advertisement agency server 100 which receives the monitoring result for each advertisement material calculates an advertisement cost of a corresponding advertisement material based on the advertiser identification code and the total broadcast advertising time and transmits the calculated advertisement cost to the advertisement company server 300 which requests broadcasting of the advertisement of the corresponding advertisement material.

Also, the advertisement company server 300 transmits the calculated advertisement cost to the advertiser such that the advertiser receives a calculated advertisement cost.

Figure 4:
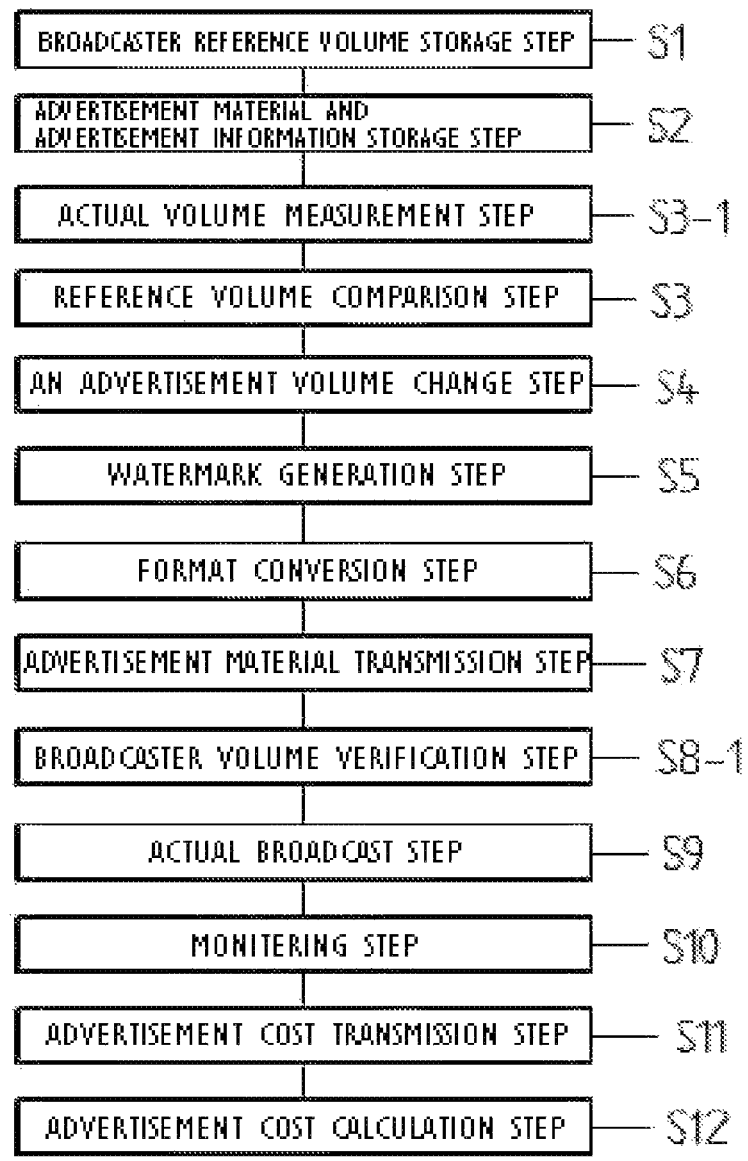
FIG. 4 is a flow chart of a broadcast advertisement volume control system according to an exemplary embodiment of the present invention.

Referring to FIG. 4, a broadcast advertisement volume control system using a watermark according to an exemplary embodiment of the present invention is described.

The broadcast advertisement volume control system of the present invention is controlled through the following steps: first, the broadcast reference volume is stored through a broadcaster reference volume storage step S1 in which the advertisement agency server 100 receives the reference volume of the broadcast program from each broadcaster through a wire or wireless communication network 600 and stores the reference volume in the broadcaster reference volume storage unit 122, and the advertisement material and the advertisement information is stored through an advertisement material and advertisement information storage step S2 in which the advertisement material and the advertisement information including the advertisement reference volume of the volume included in the advertisement material, the advertiser identification code for identifying the advertiser, the advertisement broadcasting time of the advertisement material, and the total broadcast advertising time of the advertisement material are received from the advertisement company server 300 and stored in the advertisement material storage unit 110 of the advertisement agency server 100.

Next, the reference volume is compared through a reference volume comparison step S3 in which the stored advertisement reference volume is compared to the broadcaster reference volume stored in the broadcaster reference volume storage unit 122 to determine whether there exists a difference therebetween, and when the advertisement reference volume sent from the advertisement company server is different from the broadcaster reference volume according to a comparison result, the volume of the advertisement material is changed and the advertisement information according to a changed material is stored through an advertisement volume change step S4 in which the comparison result is notified to the advertisement company server 300 through the advertisement agency server 100 to change the volume of the advertisement material and the advertisement material having the changed volume and the changed advertisement information are stored.

On the other hand, the reference volume comparison step S3 may include an actual volume measurement step S3-1 in which an average volume actually included in the advertisement material measured by the advertisement volume measurement unit 124 is compared with the advertisement reference volume, and a difference between the advertisement reference volume sent from the advertisement company and the actual reference volume may be verified through this step.

Next, the changed advertisement information is included in the advertisement material through a watermark generation step S5 in which the changed advertisement information is generated into the watermark by the watermark generation unit 130 and inserted into the advertisement material of which volume is changed, and the advertisement material including the watermark is converted and stored according to each video format of the broadcaster through a format conversion step S6 in which the advertisement material including the watermark is converted according to each video format of the broadcaster by which advertising of the advertisement material is to be performed.

Next, the advertisement material of which format is converted is transmitted to each broadcaster server 400 through an advertisement material transmission step S7 in which the advertisement material of which format is converted is transmitted to a corresponding broadcaster server 400 through the advertisement agency server 100.

Next, an actual broadcast is performed through an actual broadcast step S8 in which the advertisement material received from the advertisement agency server 100 is inserted into a specific program of a corresponding broadcaster by the broadcaster server 400 and transmitted to a local broadcaster to perform the actual broadcast.

On the other hand, the actual broadcast step S8 may include a broadcaster volume verification step S8-1 in which the volume of the broadcast is verified by the broadcaster server 400 by using a volume identification code stored in the watermark of the advertisement material, and through this step, a volume effect intended by the broadcaster is prevented from being differentiated at a time of the actual broadcast.

Next, when actually broadcasting, i.e., when the advertisement material is inserted to the specific program and broadcasted, the watermark extraction unit 510 of the monitoring apparatus 300 extracts the watermark inserted in the advertisement material and the monitoring result is transmitted to the advertisement agency server 100 through a monitoring step S9 in which the monitoring result per advertisement material is obtained by using the advertiser identification code and the advertisement broadcasting time stored in the extracted watermark and transmitted to the advertisement agency server 100.

In the advertisement agency server 100 which receives the monitoring result, the advertisement cost calculation unit 140 of the advertisement agency server 100 calculates the advertisement cost of the corresponding advertisement material based on the monitoring result and transmits the calculated advertisement cost through an advertisement cost transmission step S10 in which the advertisement cost is transmitted to the advertisement company which requests the advertisement broadcasting of the corresponding advertisement material.

On the other hand, the advertisement company server 300 calculates the advertisement cost through a calculation step S12 in which the advertisement company sends the advertisement cost to the advertiser based on the transmitted advertisement cost.

While the present invention has been shown and described with reference to certain embodiments thereof, it will be understood by those skilled in the art that various changes in form and details may be made therein without departing from the spirit and scope of the present invention as defined by the appended claims.

DESCRIPTION OF SYMBOLS

100: advertisement agency server
110: advertisement material storage unit
120: advertisement material conversion unit
121: volume level adjustment unit
122: broadcaster reference volume storage unit
123: advertisement reference volume storage unit
124: advertisement volume measurement unit
125: volume comparison unit
126: advertisement volume conversion unit
200: deliberative body server
300: advertisement company server
400: broadcaster server
410: local broadcaster
420: watermark extraction unit
430: volume verification unit
500: monitoring apparatus
600: wire or wireless network
700: advertiser
800: broadcast terminal

What is claimed is:

1. A system for controlling a volume of a broadcast advertisement comprising an advertisement agency server, a broadcaster server, a monitoring apparatus, and an advertisement company server, which are connected through a wire or wireless communication network, wherein the advertisement agency server comprises an advertisement material storage unit, an advertisement material conversion unit, an advertisement watermark generation unit, a format conversion unit, and a cost calculation unit, wherein the advertisement material storage unit stores an advertisement material comprising an advertisement material and advertisement information, the advertisement information comprising reference volume information about a volume included in the advertisement material, an advertiser identification code for identifying an advertiser, an advertisement broadcasting time of the advertisement material, and a total broadcast advertising time of the advertisement material, wherein the advertisement material conversion unit includes a volume level adjustment unit, and the volume level adjustment unit includes a broadcaster reference volume storage unit for receiving a reference volume of a broadcast program of each broadcaster from the advertisement agency server and storing the reference volume of the broadcast program, an advertisement reference volume storage unit for storing reference volume information of a volume included in the advertisement material, a volume comparison unit for comparing to determine whether an advertisement reference volume is different from a broadcaster reference volume stored in the broadcaster reference volume storage unit, and an advertisement volume conversion unit for storing the advertisement material having a changed volume and converted advertisement information in the advertisement agency server, wherein the watermark generation unit converts the changed advertisement information into watermark information to be included in the advertisement material, and the format conversion unit converts the advertisement material including a watermark according to each video format of a broadcaster by which advertising is to be performed and stores the converted advertisement material in the advertisement agency server, and the advertisement agency server sends the advertisement material of which format is converted to the broadcaster server, wherein the broadcaster server inserts the advertisement material received from the advertisement agency server into a specific broadcast program of a corresponding broadcaster to be sent to a local broadcaster for actual broadcasting, wherein the monitoring apparatus monitors the actual broadcasting of each local broadcaster and obtains a monitoring result of each advertisement material to be sent to the advertisement agency server by using a watermark extraction unit for extracting the watermark included in the advertisement material and the advertiser identification code and the advertisement broadcasting time included in the extracted watermark, and wherein the cost calculation unit calculates an advertisement cost according to the monitoring result of the each advertisement material transmitted from the monitoring apparatus to be sent to an advertisement company which requests an advertisement broadcasting of a corresponding advertisement material.

2. The system of claim 1, wherein the broadcaster server further comprises:
a watermark extraction unit for extracting the watermark included in the advertisement material; and
a volume verification unit for verifying a volume of a broadcast by using an advertisement identification code and a volume identification code stored in the watermark.

3. The system of claim 2, wherein the volume level adjustment unit of the advertisement agency server further includes an advertisement volume measurement unit for measuring an average volume actually included in the advertisement material.

4. The system of claim 1, wherein the volume level adjustment unit of the advertisement agency server further includes an advertisement volume measurement unit for measuring an average volume actually included in the advertisement material.

5. A control method of a system for controlling a volume of a broadcast advertisement comprising:
a broadcaster reference volume storage step S1 in which an advertisement agency server receives a reference volume of a broadcast program from each broadcaster and stores the reference volume in a broadcaster reference volume storage unit;

an advertisement material and advertisement information storage step S2 in which an advertisement material and advertisement information including a advertisement reference volume of a volume included in the advertisement material, an advertiser identification code for identifying an advertiser, an advertisement broadcasting time of the advertisement material, and a total broadcast advertising time of the advertisement material are received from an advertisement company server and stored in an advertisement material storage unit of the advertisement agency server;

a reference volume comparison step S3 in which the advertisement reference volume is compared to a broadcaster reference volume stored in the broadcaster reference volume storage unit to determine whether there exists a difference therebetween;

an advertisement volume change step S4 in which, when the advertisement reference volume sent from the advertisement company server is different from the broadcaster reference volume, a comparison result is notified to the advertisement company server through the advertisement agency server to change a volume of the advertisement material, and the advertisement material having the changed volume and changed advertisement information are stored;

a watermark generation step S5 in which the changed advertisement information is generated into a watermark and inserted into the advertisement material of which volume is changed;

a format conversion step S6 in which the advertisement material including the watermark is converted according to each video format of a broadcaster by which advertising of the advertisement material is to be performed;

an advertisement material transmission step S7 in which the advertisement material of which format is converted is transmitted to a corresponding broadcaster server through the advertisement agency server;

an actual broadcast step S8 in which the advertisement material received from the advertisement agency server is inserted into a specific program of a corresponding broadcaster by the broadcaster server and transmitted to a local broadcaster to perform the actual broadcast;

an actual broadcasting step S9 in which the broadcaster server inserts the advertisement material received from the advertisement agency server into a specific broadcast program of a corresponding broadcaster to be sent to a local broadcaster for actual broadcasting;

a monitoring step S10 in which, when the advertisement material is inserted into the specific broadcast program to be broadcasted, a watermark extraction unit of a monitoring apparatus extracts the watermark inserted in the advertisement material, obtains a monitoring result of each advertisement material by using the advertiser identification code and the advertisement broadcasting time stored in the extracted watermark, and transmit the monitoring result to the advertisement agency server;

an advertisement cost transmission step S11 in which an advertisement cost calculation unit of the advertisement agency server calculates an advertisement cost of a corresponding advertisement material and transmits the calculated advertisement cost to an advertisement company which requests an advertisement broadcasting of the corresponding advertisement material; and an advertisement cost calculation step S12 in which the advertisement company transmits a calculated advertisement cost to the advertiser based on the transmitted advertisement cost.

6. The method of claim 5, wherein the actual broadcast step includes a volume verification step S8-1 in which the watermark inserted into the advertisement material is extracted to verify a volume of a broadcast by using a volume identification code stored in the watermark.

7. The method of claim 6, wherein the reference volume comparison step includes an actual volume measurement step S3-1 in which an average volume actually included in the advertisement material measured by an advertisement volume measurement unit is compared with the advertisement reference volume to obtain a result thereof.

8. The method of claim 5, wherein the reference volume comparison step includes an actual volume measurement step S3-1 in which an average volume actually included in the advertisement material measured by an advertisement volume measurement unit is compared with the advertisement reference volume to obtain a result thereof.

* * * * *